United States Patent
Yamanaka et al.

(10) Patent No.: US 7,459,326 B2
(45) Date of Patent: Dec. 2, 2008

(54) METHOD FOR PRODUCING AND EPITAXIAL SUBSTRATE FOR COMPOUND SEMICONDUCTOR LIGHT-EMITTING DEVICE

(75) Inventors: Sadanori Yamanaka, Tsukuba (JP); Yoshihiko Tsuchida, Tsukuba (JP); Yoshinobu Ono, Yawara-mura (JP); Yasushi Iyechika, Matsudo (JP)

(73) Assignee: Sumitomo Chemical Company Limited, Osaka (JP)

(*) Notice: Subject to any disclaimer, the term of this patent is extended or adjusted under 35 U.S.C. 154(b) by 346 days.

(21) Appl. No.: 11/495,748

(22) Filed: Jul. 31, 2006

(65) Prior Publication Data
US 2006/0267035 A1   Nov. 30, 2006

Related U.S. Application Data

(62) Division of application No. 10/614,062, filed on Jul. 8, 2003, now Pat. No. 7,098,484.

(30) Foreign Application Priority Data

Jul. 8, 2002 (JP) ............... 2002-198955

(51) Int. Cl.
   H01L 21/00 (2006.01)
(52) U.S. Cl. .......................... 438/47; 438/46
(58) Field of Classification Search .......... 438/46, 438/47
   See application file for complete search history.

(56) References Cited

U.S. PATENT DOCUMENTS

| | | | |
|---|---|---|---|
| 6,020,602 A * | 2/2000 | Sugawara et al. | ........... 257/103 |
| 6,215,803 B1 | 4/2001 | Hata et al. | |
| 6,370,176 B1 | 4/2002 | Okumura et al. | |
| 6,459,100 B1 | 10/2002 | Doverspike et al. | |
| 6,649,942 B2 | 11/2003 | Hata et al. | |
| 2007/0170459 A1* | 7/2007 | Kyono et al. | ................. 257/103 |

FOREIGN PATENT DOCUMENTS

| | | |
|---|---|---|
| JP | 07-015041 A | 1/1995 |
| JP | 08-330629 A | 12/1996 |
| JP | 2000-58915 A | 2/2000 |
| JP | 2001-332761 A | 11/2001 |
| WO | WO-00/21144 A3 | 4/2000 |
| WO | WO-02/097904 A3 | 12/2002 |
| WO | WO-02/103814 A1 | 12/2002 |

* cited by examiner

*Primary Examiner*—Bradley K Smith
(74) *Attorney, Agent, or Firm*—Birch, Stewart, Kolasch & Birch, LLP

(57) ABSTRACT

In order to improve light-emission efficiency without degrading protection performance of a light-emitting layer structure a three p-type layer structure composed of first to third layers is provided in contact with a light-emitting layer structure. The first layer is an n-type AlGaN layer that serves as a protective layer, the third layer is a GaN:Mg layer that serves as a contact layer and the second layer is an AlGaN:Mg layer formed between these layers as an intermediate layer. The provision of the intermediate layer enables an InGaN layer to be thoroughly protected from heat during growth of layers above even if the n-type AlGaN layer is made thin, whereby the GaN:Mg layer can be brought near the light-emitting layer structure to enhance the efficiency of hole injection into the light-emitting layer structure and thus increase the light-emission efficiency.

9 Claims, 4 Drawing Sheets

FIG.2

| | FIRST LAYER THICKNESS Å | SECOND LAYER GROWTH CONDITIONS | | | | SECOND LAYER CHARACTERISTICS | | EMISSION CHARACTERISTIC |
|---|---|---|---|---|---|---|---|---|
| | | GROWTH TEMPERATURE °C | THICKNESS Å | Al CONTENT | Mg FLOW RATE sccm | CONDUCTIVITY | CARRIER DENSITY cm$^{-3}$ | LUMINOUS INTENSITY mcd |
| EXAMPLE 1 | 110 | 1000 | 250 | 0.05 | 600 | p | $6 \times 10^{18}$ | 1505 |
| EXAMPLE 2 | 110 | 1000 | 750 | 0.05 | 600 | p | $6 \times 10^{18}$ | 405 |
| EXAMPLE 3 | 110 | 1000 | 250 | 0.05 | 300 | p | $3 \times 10^{18}$ | 1459 |
| EXAMPLE 4 | 110 | 1000 | 250 | 0.05 | 100 | n | $1 \times 10^{17}$ | 280 |
| COMPARATIVE EXAMPLE 1 | 110 | 1000 | 750 | 0.05 | 100 | n | $1 \times 10^{17}$ | 75 |
| EXAMPLE 5 | 110 | 900 | 250 | 0.05 | 600 | p | $5 \times 10^{16}$ | 640 |
| EXAMPLE 6 | 110 | 800 | 250 | 0.05 | 600 | n | $5 \times 10^{15}$ | 334 |
| COMPARATIVE EXAMPLE 2 | 110 | 900 | 750 | 0.05 | 600 | p | $5 \times 10^{16}$ | 172 |
| COMPARATIVE EXAMPLE 3 | 110 | 800 | 750 | 0.05 | 600 | n | $5 \times 10^{15}$ | 90 |
| EXAMPLE 7 | 110 | 800 | 250 | 0.15 | 600 | n | $5 \times 10^{15}$ | 499 |
| EXAMPLE 8 | 55 | 800 | 250 | 0.15 | 600 | n | $5 \times 10^{15}$ | 707 |

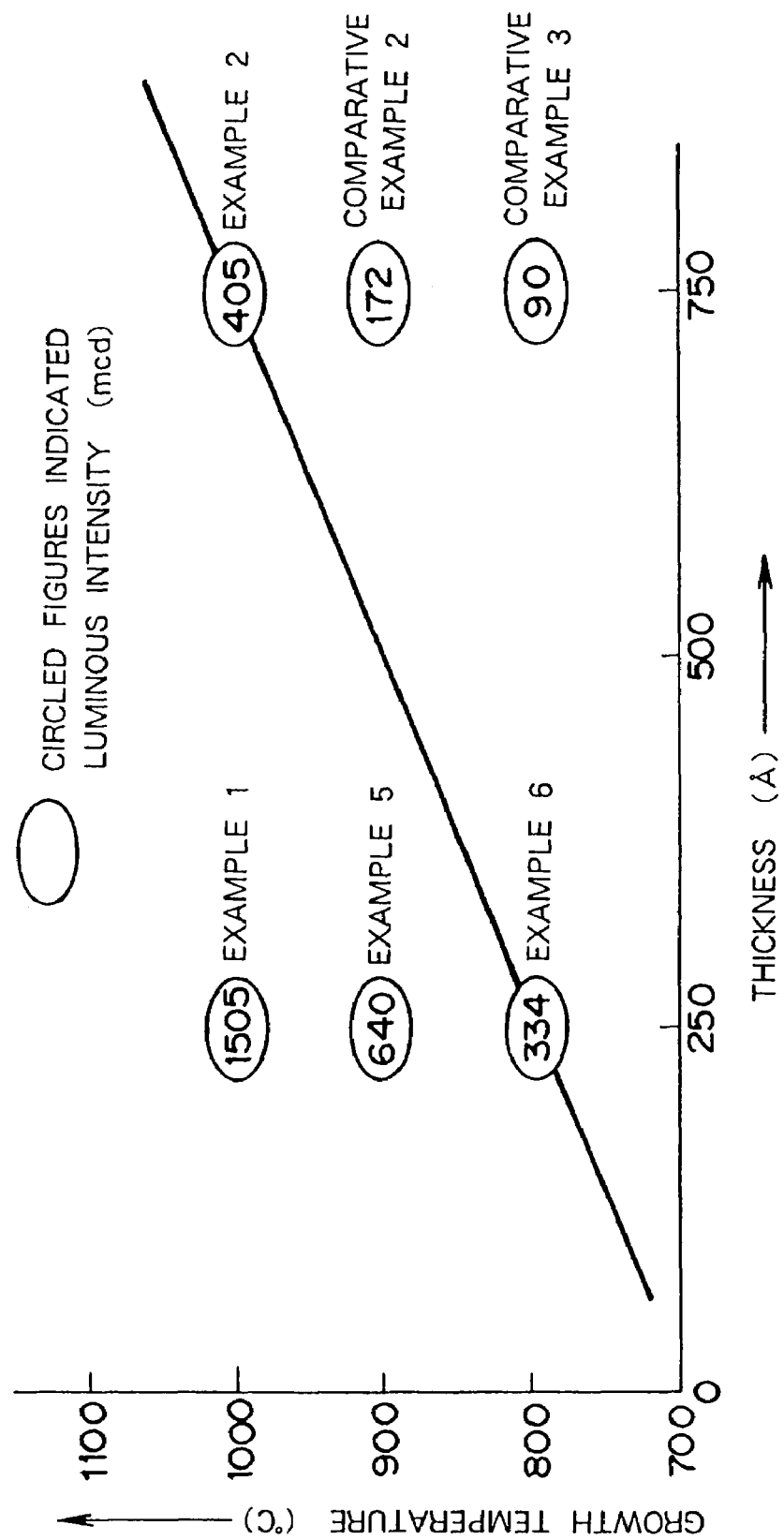

FIG.4

| | FIRST LAYER THICKNESS Å | SECOND LAYER GROWTH CONDITIONS | | | | SECOND LAYER CHARACTERISTICS | | EMISSION CHARACTERISTIC |
|---|---|---|---|---|---|---|---|---|
| | | GROWTH TEMPERATURE °C | THICKNESS Å | Al CONTENT | Mg FLOW RATE sccm | CONDUCTIVITY | CARRIER DENSITY cm−3 | LUMINOUS INTENSITY mcd |
| EXAMPLE 9 | 180 | 1050 | 250 | 0.05 | 600 | p | $2 \times 10^{18}$ | 1526 |
| EXAMPLE 10 | 180 | 1040 | 250 | 0.05 | 600 | p | $2 \times 10^{18}$ | 1090 |
| EXAMPLE 11 | 180 | 1040 | 250 | 0.025 | 600 | p | $3 \times 10^{18}$ | 923 |
| EXAMPLE 12 | 180 | 1000 | 250 | 0.05 | 600 | p | $6 \times 10^{18}$ | 1353 |
| EXAMPLE 13 | 180 | 800 | 250 | 0.05 | 600 | n | $5 \times 10^{15}$ | 994 |
| EXAMPLE 14 | 180 | 800 | 250 | 0.05 | 800 | n | $2 \times 10^{17}$ | 854 |
| EXAMPLE 15 | 180 | 800 | 250 | 0.1 | 600 | n | $5 \times 10^{15}$ | 1289 |
| EXAMPLE 16 | 180 | 800 | 250 | 0.15 | 600 | n | $5 \times 10^{15}$ | 1051 |

METHOD FOR PRODUCING AND EPITAXIAL SUBSTRATE FOR COMPOUND SEMICONDUCTOR LIGHT-EMITTING DEVICE

The present invention is a Divisional of application Ser. No. 10/614,062, filed on Jul. 8, 2003 now U.S. Pat. No. 7,098,484, the entire contents of which are hereby incorporated by reference and for which priority is claimed under 35 U.S.C. § 120.

BACKGROUND OF THE INVENTION

1. Field of the Invention

This invention relates to an epitaxial substrate for a compound semiconductor light-emitting device composed of stacked layers of nitride-system III-V Group compound semiconductor thin film, a method for producing the same, and a light-emitting device.

2. Background Art

III-V Group compound semiconductors represented by the general formula $In_xGa_yAl_zN$ (where $x+y+z=1$, $0 \leq x \leq 1$, $0 \leq y \leq 1$, $0 \leq z \leq 1$) are known as materials for purple, blue and green light-emitting diodes and blue and green laser diodes. In the following, the symbols x, y and z appearing in this general formula are sometimes used to denote InN mixed crystal ratio, GaN mixed crystal ratio and AlN mixed crystal ratio, respectively. III-V Group compound semiconductors, particularly those containing InN at a mixed crystal ratio of 10% or greater, are especially important for display applications because their emission wavelength in the visible region can be regulated by adjusting the InN mixed crystal ratio.

It is known that the physical properties of compound semiconductors are strongly affected by their mixed crystal ratios. For example, a GaAlN-sytstem mixed crystal containing no In has excellent thermal stability and can therefore be grown at a temperature of 1,000° C. or higher to obtain good crystallinity. In contrast, the thermal stability of an InGaAlN-system mixed crystal (containing In), though differing with the InN mixed crystal ratio, is not so good, so this compound semiconductor is generally grown at a relatively low temperature of around 800° C. As a result, the InGaAlN-system mixed crystal growth layer constituting an important growth layer of the light-emitting layer structure of a visible-light-region light-emitting device has to be grown at a low temperature and is therefore frequently inadequate in thermal stability.

On the other hand, once the light-emitting layer structure has been grown, it is overlaid with a p-type layer that has to be grown at a high temperature. In order to protect the thermally unstable light-emitting layer structure from this high growth temperature, the conventional practice has therefore been to first grow a protective layer having high heat resistance on the light-emitting layer structure and then grow the p-type layer on the protective layer at a high growth temperature.

This protective layer is an important layer that not only works to protect the light-emitting layer structure but also has a strong effect on the emission characteristics of the light-emitting device. Specifically, it is deeply involved in the process whereby light emission is caused by recombination of holes effectively injected into the light-emitting layer structure from the p-type layer formed on the protective layer with electrons injected into the light-emitting layer structure from its lower side. In order to enhance the efficiency of hole injection into the light-emitting layer structure from the p-type layer side, it is preferable for the protective layer to have p-type conductivity or n-type conductivity of low carrier density.

However, when a protective layer containing Al is grown at the same temperature as that at which the light-emitting layer structure was grown, the crystallinity of the protective layer is not good. Owing to the presence of many lattice defects, therefore, it exhibits high n-type conductivity of ordinary carrier density. The injection efficiency of holes into the light-emitting layer structure is therefore lowered and it becomes difficult to achieve high light-emission efficiency.

The protective layer and p-type layer growth conditions therefore have to be optimized from the two aspects of improving protective performance and maintaining hole injection efficiency. The protective layer is required to protect the light-emitting layer structure from heat and, while maintaining high crystal quality, to control conductivity for ensuring efficient hole injection from the p-type layer into the light-emitting layer structure.

The prior art provides two methods for enabling this optimization: (a) the method of first growing a protective layer of AlGaN, then heating the protective layer to the growth temperature of a p-type GaN layer (contact layer), and finally growing the p-type GaN layer, and (b) the method of forming a protective layer as an Al-free GaN layer growable at a low temperature, thereby enhancing the crystallinity of the protective layer and making the background-type carrier density somewhat low.

However, when method (a) is adopted, the protective layer must be grown to at least a given thickness to prevent degradation of the p-type GaN layer (contact layer) in the course of growth. Since the resulting increase in layer thickness separates the pn junction interface from the light-emitting layer structure, the efficiency of hole injection into the light-emitting layer structure decreases. Moreover, owing to the fact that the performance of the AlGaN layer as a protective layer declines with decreasing Al content, the GaN protective layer of the prior art method (b) also has to be increased in thickness, so that no improvement in light-emission efficiency can be expected.

SUMMARY OF THE INVENTION

An object of the present invention is to provide an epitaxial substrate for compound semiconductor light-emitting device, a method for producing the same and a light-emitting device utilizing these, which can overcome the above-mentioned problems in prior arts.

Another object of the present invention is to provide an epitaxial substrate for compound semiconductor light-emitting device, a method for producing the same and a light-emitting device, which enable highly efficient injection of holes into the light-emitting layer structure without impairing the protective layer's ability to protect the light-emitting layer structure.

The present invention achieves the foregoing objects by inserting between the protective layer and the p-type layer an intermediate layer so as to ensure excellent protective performance even when the protective layer is made thin and to increase hole injection efficiency and enhance light-emission efficiency by bringing the p-type layer close to the light-emitting layer structure.

A feature of the present invention is that in an epitaxial substrate for compound semiconductor light-emitting device comprising a double-hetero light-emitting layer structure, it includes a pn junction and a p-type layer side layer structure formed in contact with the light-emitting layer structure including in order from the layer in contact with the light-emitting layer structure an n-type first layer represented by $In_xAl_yGa_zN$ ($x+y+z=1$, $0 \leq x \leq 1$, $0 \leq y \leq 1$, $0 \leq z \leq 1$), a p-type second layer represented by $In_uAl_vGa_wN$ ($u+v+w=1$, $0 \leq u \leq 1$, $0 \leq v \leq 1$, $0 \leq w \leq 1$) and a p-type third layer represented by $In_pAl_qGa_rN$ ($p+q+r=1$, $0 \leq p \leq 1$, $0 \leq q \leq 1$, $0 \leq r \leq 1$), each of the three layers being formed in contact with its neighbor. It is preferred that a thickness $d_1$ (Å) of the first layer is in the range of $5 \leq d_1 \leq 200$ and a thickness $d_2$ (Å) of the second layer is in the range of $5 \leq d_2 \leq 30,000$.

Another feature of the present invention is that, in the method for producing an epitaxial substrate for compound semiconductor light-emitting device, a growth temperature $T_1$ of the first layer and a growth temperature of $T_2$ of the second layer are made to satisfy the relationship $T_1 \leq T_2$.

Another feature of the present invention is that the second layer is grown to satisfy the relationships:

$$5 \leq d_2 \leq 30,000 \ (900 \leq T_2 \leq 1,150)$$

$$T_2 \geq 0.4 \ d_2 + 700 \ (700 \leq T_2 < 900),$$

where $T_2$ (° C.) is the growth temperature of the second layer and $d_2$ (Å) is the thickness of the second layer.

A light-emitting device with excellent emission characteristics is produced by fabricating the light-emitting device using the epitaxial substrate produced in the foregoing manner.

A feature of the present invention is that in an epitaxial substrate for compound semiconductor light-emitting device comprising a double-hetero light-emitting layer structure, it includes a pn junction and a p-type layer side layer structure formed in contact with the light-emitting layer structure including in order from the layer in contact with the light-emitting layer structure an n-type first layer represented by $In_xAl_yGa_zN$ ($x+y+z=1$, $0 \leq x \leq 1$, $0 \leq y \leq 1$, $0 \leq z \leq 1$), an n-type second layer represented by $In_uAl_vGa_wN$ ($u+v+w=1$, $0 \leq u \leq 1$, $0 \leq v \leq 1$, $0 \leq w \leq 1$) and a p-type third layer represented by $In_pAl_qGa_rN$ ($p+q+r=1$, $0 \leq p \leq 1$, $0 \leq q \leq 1$, $0 \leq r \leq 1$), each of the three layers being formed in contact with its neighbor.

Here, it is preferred that the p-type dopant density of the second layer is not less than $1 \times 10^{17}$ cm$^{-3}$ and not greater than $1 \times 10^{21}$ cm$^{-3}$, and the n-type carrier density of the second layer is not greater than $1 \times 10^{19}$ cm$^{-3}$.

Moreover, it is preferred that a thickness $d_1$ (Å) of the first layer is in the range of $5 \leq d_1 \leq 200$ and a thickness $d_2$ (Å) of the second layer is in the range of $5 \leq d_2 \leq 500$.

Another feature of the present invention is that a growth temperature $T_1$ of the first layer and a growth temperature of $T_2$ of the second layer are made to satisfy the relationship $T_1 \leq T_2$. Here, it is preferred that the second layer is grown to satisfy the relationships:

$$T_2 \geq 0.4 d_2 + 700 \ (5 \leq d_2 \leq 500)$$

$$1,150 \geq T_2 \geq 700,$$

where $T_2$ (° C.) is the growth temperature of the second layer and $d_2$ (Å) is the thickness of the second layer.

The invention will be better understood and other objects and advantages thereof will be more apparent from the following detailed description of preferred embodiments with reference to the accompanying drawings.

BRRIEF EXPLANATION OF THE DRAWING

FIG. 2 is a table summarizing data related to first to eighth working examples of the present invention and first to third comparative examples.

FIG. 3 is a graph created using data from FIG. 2 to illustrate how luminous intensity varies as a function of second layer thickness and growth temperature in a light-emitting device structured in the manner of FIG. 1.

FIG. 4 is a table summarizing data related to ninth to sixteenth working examples of the present invention.

DETAILED DESCRIPTION OF THE PREFERRED EMBODIMENT

Figure 1:
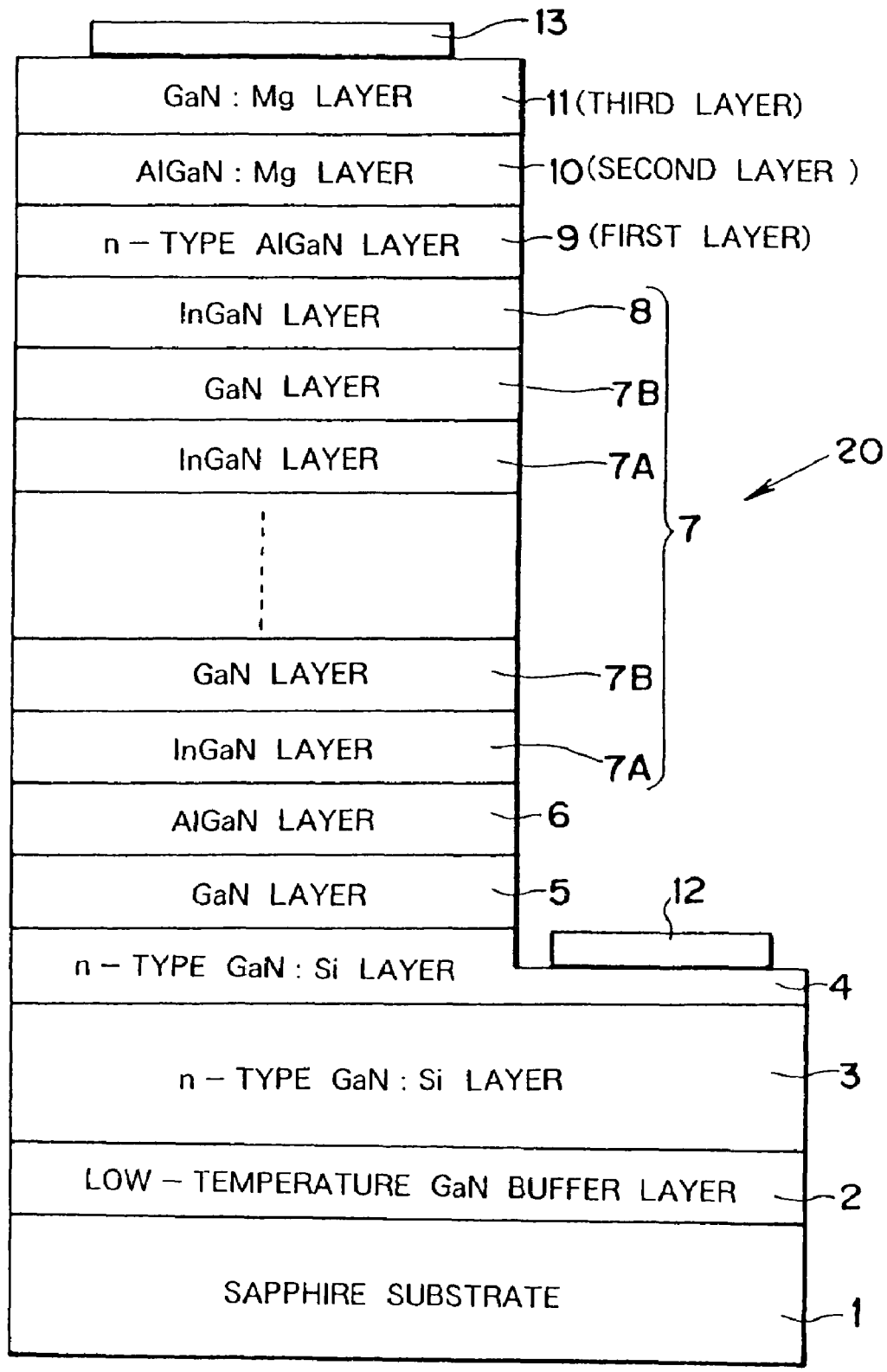
FIG. 1 is a structural diagram showing an embodiment of the present invention.

FIG. 1 shows the layer structure of a light-emitting device that is an embodiment of the present invention. The light-emitting device shown in FIG. 1 was fabricated using an epitaxial substrate for a compound semiconductor light-emitting device according to the present invention.

The layer structure of the light-emitting device 20 will be explained first. The structure includes a low-temperature GaN buffer layer 2, n-type GaN:Si layer 3, n-type GaN:Si layer 4 and GaN layer 5 formed in order on a sapphire substrate 1 by epitaxial growth using the metalorganic vapor phase epitaxial (MOVPE) process. An AlGaN layer 6 is formed on the GaN layer 5 and a light-emitting layer structure 7 is formed on the AlGaN layer 6. The AlGaN layer 6 and light-emitting layer structure 7 are formed successively by MOVPE epitaxial growth.

It should be noted that the invention is not limited to use of a sapphire substrate as in this embodiment. Any of various other substrates are also usable, including a SiC, GaN substrate reduced in dislocation density by embedded growth, GaN-on-Si substrate, free-standing GaN substrate, AlN substrate and the like. Moreover, the buffer layer need not necessarily be formed of a low-temperature GaN layer but can instead be made of any of various other materials, including low-temperature AlN, low-temperature AlGaN, low-temperature InGaAlN and the like.

The light-emitting layer structure 7, which is a double-hetero-structure having a pn junction, is composed of a multilayer quantum well structure constituted of InGaN layers 7A and GaN layers 7B grown alternately in four sets, and an InGaN layer 8 grown on the uppermost set. The growth temperature of the InGaN layer 8 is 780° C. A p-type layer side three-layer structure composed of first, second and third layers is formed on and in contact with the light-emitting layer structure 7. In this embodiment, the p-type layer side structure formed in contact with the light-emitting layer structure 7 is composed of, in order from the layer in contact with the light-emitting layer structure 7, an n-type AlGaN layer (first layer) 9, AlGaN:Mg layer (second layer) 10 and GaN: Mg layer (third layer) 11. The three layers are formed each in contact with its neighbor.

The first layer, i.e., the n-type AlGaN layer 9, is formed by crystal growth using MOVPE at the same temperature of 780° C. as used for the InGaN layer 8. The second layer, i.e., the AlGaN:Mg layer 10, is formed by crystal growth using MOVPE at a higher temperature of 1,000° C. than that used for the n-type AlGaN layer 9. The third layer, i.e., the GaN: Mg layer 11, is formed by crystal growth using MOVPE at a higher temperature of 1,040° C. than that used for the AlGaN: Mg layer 10.

In this embodiment, the AlGaN:Mg (second) layer 10 and the GaN:Mg (third) layer 11 are low-resistance p-type layers. An ohmic n electrode 12 is formed on the n-type GaN:Si layer 4 and an ohmic p electrode 13 is formed on the GaN:Mg layer 11.

In the fabrication of the light-emitting device 20 having the layer structure explained in the foregoing, an epitaxial substrate for a compound semiconductor light-emitting device is first fabricated by forming the layer structure described in the foregoing on the sapphire substrate 1 and the light-emitting device 20 is then fabricated in the form shown in FIG. 1 using this epitaxial substrate.

In the p-type layer side three-layer structure formed in contact with the light-emitting layer structure 7, the n-type AlGaN (first) layer 9 serves as a protective layer, the GaN:Mg layer (third) 11 serves as a contact layer, and the AlGaN:Mg (second) layer 10 is situated between these two layers as an intermediate layer. Thanks to the provision of this intermediate layer, the InGaN layer 8 can be thoroughly protected from heat during growth of the layers above even if the n-type AlGaN layer 9 is made thin. Since the GaN:Mg layer 11 can therefore be brought close to the light-emitting layer structure 7 to enable more efficient injection of holes into the light-emitting layer structure 7, the light-emission efficiency of the light-emitting device 20 can be enhanced.

Although the AlGaN:Mg (second) layer 10 in the embodiment of FIG. 1 has p-type conductivity, it is not limited to this conductivity type and can have n-type conductivity instead. Formation of the second layer as an n-type compound semiconductor can be achieved by changing the growth conditions. Even if the second layer is formed as an n-type AlGaN:Mg layer instead of the p-type AlGaN:Mg layer 10, the InGaN layers 7A and 8 can still be effectively protected from heat during growth of the layers above and the efficiency of hole injection into the light-emitting layer structure 7 can be increased to enhance light-emission efficiency just as in this first embodiment.

A general explanation will now be given regarding the first to third layers constituting the p-type layer side structure.

As the first layer is provided on the side of p-type layer of the light-emitting layer structure 7, it should, in view of its basic function, preferably have p-type or low-density n-type conductivity so as to increase light-emission efficiency. However, the growth temperature of the first layer is ordinarily set at a relatively low temperature (780° C. in this embodiment) equal to that of the light-emitting layer structure 7 so as not degrade the crystallinity of the light-emitting layer structure 7 containing In, which has low temperature resistance. It therefore has n-type conductivity even without doping owing to the presence of n-type carriers thought to originate from crystal defects. Because of the low growth temperature, it is in actual practice very difficult to make the n-type AlGaN layer 9 into a low-density n-type or p-type layer by using a p-type dopant to compensate for the n-type charge.

In addition, p-type dopant tends to remain in the reaction furnace. It may therefore have a greater adverse effect on the quality of the light-emitting layer structure fabricated at later growth stage than on the growth at the time it is used. This is known as the memory effect. One effective measure for overcoming this problem is to use a reaction furnace designed to minimize the memory effect of the p-type dopant. Another is to employ separate reaction furnaces for the crystal growth using p-type dopant and for the crystal growth not using p-type dopant, chiefly the growth through light-emitting layer structure fabrication. The n-type AlGaN (first) layer 9 is a protective layer grown next after the light-emitting layer structure 7 and therefore should preferably be grown in a furnace that does not use p-type dopant. For the reason explained above, the first layer tends to become n-type when no p-type dopant is used. In this embodiment, therefore, a first layer of n-type, namely, the n-type AlGaN layer 9, is used. But, as is clear from the foregoing explanation, it is also possible to use instead a p-type first layer produced under appropriate crystal growth conditions.

The preferable range of the Al content of the first layer is defined with consideration to the fact that excessive Al degrades surface flatness and other crystalline properties, while insufficient Al degrades protective performance, which makes it necessary to increase the layer thickness and it leads to degrade the light-emission efficiency. In light of these factors, the Al content is preferably in the approximate range of 0-0.5. The preferable range of Al content depends on the thickness of the first layer and the growth temperature of the second layer. The Al content must be increased to strengthen protective performance in proportion as the first layer is thinner and the growth temperature of the second layer is higher.

The preferable range of the thickness of the first layer is defined with consideration to the fact that when it is too great, the layer becomes poor in crystallinity and the hole injection efficiency decreases to lower the light-emission efficiency, while when it is too small, the protective performance of the layer declines, which leads to degradation of the light-emitting layer structure. In light of these factors, the thickness of the first layer is preferably in the approximate range of 5 Å-200 Å. The preferable range of layer thickness depends on the Al content of the first layer and the growth temperature of the second layer. The thickness of the first layer must be increased in proportion as its Al content is lower in order to achieve adequate protective performance. The thickness of the second layer must be increased in proportion as its growth temperature is higher in order to prevent high-temperature degradation of the light-emitting layer structure.

The second layer will now be explained. From the viewpoint of enhancing the light-emitting characteristics by effective carrier confinement, the Al content of the second layer is preferably set high so as to increase the potential barrier with respect to the light-emitting layer structure in the conduction band. However, excessive Al content of the second layer degrades crystallinity to make realization of p-type or low-density n-type conductivity difficult and thus lower hole injection efficiency. The Al content of the second layer therefore preferably falls within a certain range. Specifically, the Al content of the second layer preferably falls within the approximate range of 0.001-0.3. The preferable range of Al content depends on the growth temperature, the p-type dopant flow rate, and the layer thickness. The tendency toward n-type conductivity increases owing to crystal defects to degrade hole injection efficiency in proportion as the growth temperature is lower. To prevent degradation by this mechanism, the Al content has to be reduced to maintain good crystallinity. The tendency toward n-type conductivity also increases to degrade hole injection efficiency in proportion as the p-type dopant flow rate is smaller. To prevent this type of degradation by this mechanism, the Al content has to be reduced to suppress the tendency toward n-type conductivity. In addition, decline in crystallinity owing to increase in strain caused by lattice mismatching is liable to become more pronounced with increasing layer thickness. The Al content must be made small to prevent this.

Explanation will now be made regarding the thickness of the second layer. The second layer constitutes the second layer of the three p-type layer structure provided on the p-type layer side of the light-emitting layer structure 7. As was explained earlier, the conductivity of the second layer can be either n-type or p-type. The thickness of the second layer will therefore be explained separately for the cases where the conductivity of the second layer is n-type and p-type.

When an n-type second layer is too thick, the crystal quality tends to decline and the hole injection efficiency to the light-emitting layer structure 7 may decrease to degrade the light-emission efficiency. Basically, a thinner thickness is better and the thickness preferably falls within a certain range. When a p-type second layer is too thick, the crystal quality is degraded. The thickness therefore falls within a certain range. However, the effect on light-emission efficiency for p-type layer is not as pronounced as in the case of a n-type layer, so that the preferable thickness range is broader. The thickness $d_2$ of an n-type layer is preferably in the approximate range of 5 Å-500 Å. The thickness $d_2$ of a p-type layer is preferably in the approximate range of 5 Å-30,000 Å. As the reproducibility of the second layer is difficult to maintain during fabrication when the thickness $d_2$ is too small, it is considered that a thickness of at least about 5 Å is necessary. The upper limit of thickness in the case of an n-type second layer can be determined experimentally as the largest thickness that does not cause a marked decrease in light output owing to decline in hole injection efficiency. The upper limit of thickness in the case of a p-type second layer is determined as the largest thickness that does not degrade either crystal quality or lower production efficiency.

The preferable second layer thickness range depends on the growth temperature, Al content and p-type dopant flow rate of the second layer. In the case of an n-type layer, the n-type carrier density increases in proportion as the growth temperature is lower, the p-type dopant flow rate of is smaller and the Al content is higher. An increase in carrier density lowers the hole injection efficiency to the light-emitting layer structure and, by this, may decrease the light-emission efficiency. This must be prevented by making the thickness of the layer small. Representing the thickness $d_2$ and growth temperature $T_2$ of the second layer on the x-axis and y-axis, the preferable ranges of the thickness and growth temperature of an n-type second layer can be defined as:

$5 \leq d_2 \leq 500$ $T_2 \geq 0.4 d_2 + 700$ $1{,}150 \geq T_2 \geq 700$

In the case of a p-type second layer, the crystal quality may decline in proportion as the growth temperature is lower and the Al content is higher. The layer thickness therefore must be made small to prevent decline in light-emission efficiency. Representing the thickness $d_2$ and growth temperature $T_2$ of the second layer on the x-axis and y-axis, the preferable ranges of the thickness and growth temperature of a p-type second layer can be defined as:

$0.4 d_2 + 700 \leq T_2 \leq 1{,}150$ $(5 \leq d_2 \leq 500)$ $900 \leq T_2 \leq 1{,}150$ $(500 \leq d_2 \leq 30{,}000)$.

More preferable ranges of the thickness and growth temperature of a p-type second layer are:

$0.4 d_2 + 700 \leq T_2 \leq 1{,}100$ $(5 \leq d_2 < 500)$ $900 \leq T_2 < 1{,}100$ $(500 \leq d_2 \leq 30{,}000)$.

Explanation will now be made regarding conductivity control, carrier density and growth temperature of the second layer. For the same reason as mentioned in the explanation regarding the thickness of the second layer, the explanation regarding conductivity control, carrier density and growth temperature of the second layer will again, when necessary, be made separately for the cases where the conductivity of the second layer is n-type and p-type.

As pointed out earlier, the conductivity of the second layer may be either p-type or n-type. When the conductivity of the second layer is p-type, there is no particular preferable range of carrier density and any value within the technically feasible range can be adopted. This range extends from about $1 \times 10^{16}$ cm$^{-3}$ to about $1 \times 10^{20}$ cm$^{-3}$. When the conductivity of the second layer is n-type, the carrier density is preferably made as small as possible so as not to degrade hole injection efficiency. The range of carrier density is therefore preferably approximately $1 \times 10^{14}$ cm$^{-3}$ -$1 \times 10^{19}$ cm$^{-3}$, more preferably $1 \times 10^{14}$ cm$^{-3}$ -$1 \times 10^{18}$ cm$^{-3}$.

The carrier density can be controlled by controlling the growth temperature, II/III ratio (feed ratio of p-type dopant to III Group source material; the p-type dopant flow rate if the supply of III Group source material is constant), and the V/III ratio (ratio of V Group source material to III group source material).

Regardless of whether the second layer has p-type or n-type conductivity, the control of carrier density becomes easier as crystal quality improves with increasing growth temperature. Particularly in the case of an n-type second layer, the p-type dopant flow rate required for conductivity control decreases with increasing growth temperature.

The preferable ranges of the II/III ratio and the V/III ratio vary so greatly with the configuration, size, source gas flow pattern, growth temperature, pressure and other conditions of the reaction furnace that setting general numerical limits is meaningless. As a general tendency, the preferable II/III ratio range expands toward the smaller value side with increasing growth temperature.

A detailed explanation will now be made regarding the growth temperature of the second layer. Selecting a second layer growth temperature that is closer to the growth temperature of the light-emitting layer structure 7 is better from the viewpoint of maintaining the protective performance of the n-type AlGaN (first) layer 9 and avoiding damage to the light-emitting layer structure 7. On the other hand, however, a high growth temperature is better from the viewpoint of second layer crystal quality improvement and conductivity control. The second layer growth temperature therefore preferably falls within a certain range. The preferable range is between about 700° C. and 1,150° C.

The preferable growth temperature range of the second layer varies depending on the thickness and Al content of the first layer, and the Al content and p-type dopant flow rate of the second layer. Since the ability of the first layer to protect the light-emitting layer structure improves with increasing layer thickness and Al content, the crystal quality of the second layer can be enhanced by shifting the preferable growth temperature range of the second layer toward the high temperature side. On the other hand, since conductivity control becomes increasingly difficult with higher Al content of the second layer, the preferable growth temperature range of the second layer has to be shifted increasingly toward the growth temperature side that facilitates conductivity control as the Al content of the second layer increases. Owing to the fact that p-type conductivity becomes more difficult to establish in proportion as the p-type dopant flow rate of the second layer decreases, the preferable growth temperature of the second layer has to be increased to obtain p-type or low-density n-type conductivity.

In the case of fabricating a light-emitting device using a III-V Group compound semiconductor, a step of doping with a p-type dopant is indispensable. However, the p-type dopant source material remains in the reaction furnace, where it adversely affects the next growth process by giving rise to a memory effect. More specifically, when a new substrate is set in the reaction furnace and the next epitaxial growth process is conducted, the crystallinity of the light-emitting layers formed on the substrate is degraded and control of the p-type conductivity density becomes difficulty owing to the presence of p-type dopant source material remaining from the preceding step.

These inconveniences caused by the memory effect can be avoided by employing two reaction furnaces, one that uses and one that does not use p-type dopant source material, to grow a light-emitting device structure epitaxial substrate as shown in FIG. 1. That is, the so-called regrowth method can be adopted.

This will be explained more concretely. When an epitaxial substrate for a compound semiconductor light-emitting device of the layer structure shown in FIG. 1 is produced, the substrate is once removed from the reaction furnace after the n-type AlGaN (first) layer 9 has been grown and the AlGaN:Mg (second) layer 10 and ensuing layers are grown in a separate reaction furnace that uses p-type dopant source material. By this, it is possible to avoid the memory effect and fabricate an epitaxial substrate exhibiting stable characteristics.

The GaN:Mg layer 11 formed as the third layer is a p-type layer for establishing ohmic contact with the n-type GaN layer 13. In the present invention, the purpose of forming the three p-type layer structure on the InGaN layer 8 is, as explained in the foregoing, to define the structure and growth conditions of the n-type AlGaN layer 9 and AlGaN:Mg layer 10 constituting the first and second layers, the structures of the third and ensuing layers can be defined arbitrarily. Therefore, the GaN: Mg layer 11, for example, can be a single layer structure or otherwise can be a multilayer structure composed of two or more layers varying in p-type carrier density or a multilayer structure composed of two or more layers varying in composition. Otherwise it can be a multilayer structure in which the outermost surface layer of the plural layers is a high-density p-type thin layer.

EXAMPLE 1

The multilayer light-emitting device shown in FIG. 1 was fabricated as explained in the following by using the MOVPE process to grow crystal layers on a sapphire substrate. First, an epitaxial substrate for a compound semiconductor light-emitting device was fabricated starting with a sapphire substrate 1. The sapphire substrate 1 was set in an MOVPE growth furnace and a thin layer of GaN was grown on the sapphire substrate 1 as the low-temperature GaN buffer layer 2 using $NH_3$, MO (TMG) and silane as source gases and $H_2$ as carrier gas. The n-type GaN:Si layer 3 was then grown at 1040° C.

The sapphire substrate 1 was then once removed from the MOVPE growth furnace, subjected to a prescribed inspection, and returned to the MOVPE growth furnace. The n-type GaN: Si layer 4 was then grown on the n-type GaN : Si layer 3 at a growth temperature of 1040° C. using $NH_3$, MO (TMG, TMA and TMI) and silane as source gases and $H_2$ as carrier gas. The undoped GaN layer 5 was next grown on the n-type GaN:Si layer 4. After formation of the undoped GaN layer 5, the reaction furnace temperature was lowered to 780° C. and the AlGaN layer 6 was formed using $N_2$ as carrier gas. Next, four layer sets each composed of an InGaN layer 7A and a GaN layer 7B were grown and the InGaN layer 8 was grown on the uppermost GaN layer 7B, thereby forming the light-emitting layer structure 7. After the InGaN layer 8 had been grown, the n-type AlGaN layer 9 (undoped n-type layer) was grown to a thickness of 110 Å as the first layer with an Al content of 0.15. The substrate was then removed from the MOVPE growth furnace.

The substrate was next set in another MOVPE growth furnace and the AlGaN:Mg layer 10 was grown as the second layer with an Al content of 0.05 using $NH_3$ and MO as sources gases and $N_2$ a carrier gas. Here, the flow rate of the EtCp 2 Mg supplied as the Mg material was set at 600 sccm, growth was continued to 250 Å at 1,000° C., the reaction furnace temperature was raised to 1,040° C., and the GaN:Mg layer 11 was grown. The result was taken out of the growth furnace as an epitaxial substrate for a compound semiconductor light-emitting device.

The epitaxial substrate for a compound semiconductor light-emitting device produced in the foregoing manner was heat treated for 20 minutes in an 800° C. $N_2$ atmosphere so as to make the AlGaN:Mg (second) layer 10 and GaN:Mg (third) layer 11 low-resistance p-type layers.

Next, the surface was formed with a pattern for a p-type electrode by photolithography, Ni and Au were deposited by vacuum vapor deposition, an electrode pattern was formed by liftoff, and the result was heat treated to form the ohmic p electrode 13. A mask pattern was then formed by photolithography and dry etching was conducted to expose the n layer. After mask removal, a pattern for an n electrode was formed on the dry-etched surface by photolithography, Al was deposited by vacuum vapor deposition, and an electrode pattern was formed by liftoff to serve as the n electrode 12. The electrode area of the p electrode 13 was $3.14 \times 10^{-4}$ cm$^2$.

An epitaxial substrate for a compound semiconductor light-emitting device produced in the foregoing manner was used to fabricate a semiconductor light-emitting device. The light-emitting device was applied with voltage to examine its emission characteristic in the wafer state. The light-emitting device was found to exhibit excellent emission characteristics of 1,505 mcd at 20 mA forward current and leak current of 0.25 nA at 5 V reverse bias.

In order to assess the conductivity of the second layer grown under the foregoing conditions, undoped GaN was grown to a thickness of 3 μm on a sapphire substrate and an AlGaN:Mg layer was grown thereon to a thickness of 0.3 μm under the same conditions as set out regarding the second layer 10 in the foregoing. By cyclic voltammetry (CV) assessment using an electrolyte, the so-obtained specimen was found to exhibit p-type conductivity type and a carrier density of $9 \times 10^{18}$ cm$^{-3}$.

EXAMPLES 2-8 AND COMPARATIVE EXAMPLES 1-3

Light-emitting devices were fabricated by the method of Example 1 except that the AlGaN: Mg layer was formed under growth conditions differing variously in growth temperature, layer thickness, Al content and Mg flow rate. Growth conditions and characteristics of the light-emitting devices are summarized in FIG. 2.

In Examples 4, 6, 7 and 8, although the second layer formed of AlGaN:Mg was doped with p-type dopant, it exhibited n-type conductivity and an n-type carrier density of not greater than $1 \times 10^{19}$ cm$^{-3}$, a value falling within the scope of the ninth aspect of the present invention.

In Comparative Example 1, the thickness of the second layer, d was 750 Å, a value outside the preferable range specified by the invention. It will be noted that the luminous intensity of the light-emitting device was markedly inferior to that of Example 4, which was fabricated under the same conditions except for the thickness of the second layer. Specifically, the three-fold increase in the thickness of the second layer from 250 Å (Example 4) to 750 Å (Comparative Example 1) reduced the luminous intensity to about one-fourth the value of Example 4.

Comparative Example 2 was fabricated under the same growth conditions as Example 5 except that the second layer was again given a large thickness of 750 Å. It will be noted that the luminous intensity fell to about one-fourth.

Comparative Example 3 was fabricated under the same growth conditions as Example 6 except that the second layer was again given a large thickness of 750 Å. It will be noted that the luminous intensity fell to about one-fourth.

FIG. 3 is a graph based on data contained in FIG. 2 for the examples in which the Mg flow rate was 600 sccm and the Al content of the second layer was 0.05. The vertical axis is scaled for second layer thickness (Å) and the horizontal axis for growth temperature (° C.). The encircled figures indicate luminous intensity (mcd).

The luminous intensity of the light-emitting device of the Example 2 was 405 mcd and that of Example 6 was nearly the same at 334 mcd. Light-emitting devices exhibiting luminous intensity values lying on and above a line segment connecting these two measurement points are suitable for practical application while those with luminous intensity values lying below the line segment are not. Therefore, where the growth temperature is defined as T and the thickness of the second layer as d, this empirically defined region above and including the line segment can be represented as:

$$T-800 \geq 2(d-250)/5.$$

The relationship between T and d can therefore be written as:

$$T \geq 0.4 d+700.$$

In other words, in order to ensure excellent luminous intensity, the second layer must be grown at a growth temperature (° C.) equal to or greater than the value obtained by adding 700 to the product of the thickness d and 0.4.

EXAMPLES 9-16

Examples 9 to 16 of the present invention will now be explained. In Examples 9 to 16, light-emitting devices were fabricated under the same conditions as in Example 1 except that an AlGaN layer 9 having an Al content of 0 was used as the first layer, i.e., the first layer was formed as an n-type GaN layer of 180 Å thickness, and the AlGaN: Mg (second) layer 10 was formed under growth conditions differing variously in growth temperature, Al content and Mg flow rate.

FIG. 4 shows growth conditions and characteristics of each of the light-emitting devices fabricated in Examples 9 to 16, specifically second layer growth conditions (growth temperature (° C.), thickness (Å), Al content and Mg flow rate (sccm)), characteristics of the second layer (conductivity type and carrier density ($cm^{-3}$)), and measured emission characteristic (luminous intensity (mcd)). In Examples 9-16, the second layer was grown at a growth temperature (° C.) equal to or higher than the value obtained by adding 700 to the product of the thickness d and 0.4. In Examples 13-16, although the second layer formed of AlGaN:Mg was doped with p-type dopant, it exhibited n-type conductivity and an n-type carrier density of not greater $1 \times 10^{19}$ $cm^{-3}$, a value falling within the scope of the ninth aspect of the present invention. The light-emitting devices of Examples 9 to 16 were assessed for their emission characteristics and, as can be seen from FIG. 4, all were found to exhibit luminous intensity of a level adequate for practical application.

As explained in the foregoing, the present invention optimizes the structure of a p-type layer structure formed in contact with the light-emitting layer structure, namely, defines the p-type layer structure as a three p-type layer structure composed of a protective layer (first layer), a p-type layer (third layer) and an intermediate layer (second layer) interposed between the first and third layers, and also optimizes the growth conditions of the three p-type layer structure. As such, the present invention improves crystallinity in the vicinity of the pn junction, thereby facilitating hole injection, without degrading the light-emitting layer structure protection performance of the three p-type layer structure. As a result, the protective layer (first layer) can provide excellent protective performance even if formed to a small thickness and the hole injection efficiency can be enhanced to realize an improvement in light-emission efficiency.

What is claimed is:

1. A method for producing an epitaxial substrate for a compound semiconductor light-emitting device comprising:
   a double-hetero light-emitting layer structure including a pn junction; and
   a p-type layer side layer structure formed in contact with the light-emitting layer structure including in order from the layer in contact with the light-emitting layer structure an n-type first layer represented by $In_xAl_yGa_zN$ ($x+y+z=1$, $0 \leq x \leq 1$, $0 \leq y \leq 1$, $0 \leq z \leq 1$), a p-type second layer represented by $In_uAl_vGa_wN$ ($u+v+w=1$, $0 \leq u \leq 1$, $0 \leq v \leq 1$, $0 \leq w \leq 1$) and a p-type third layer represented by $In_pAl_qGa_rN$ ($p+q+r=1$, $0 \leq p \leq 1$, $0 \leq q \leq 1$, $0 \leq r \leq 1$), each of the three layers being formed in contact with its neighbor;
   said method comprising:
   growing the substrate at a growth temperature $T_1$ of the first layer and a growth temperature of $T_2$ of the second layer are made to satisfy the relationship $T_1 \leq T_2$.

2. The method for producing an epitaxial substrate for a compound semiconductor light-emitting device of claim 1, wherein a thickness $d_i$ (Å) of the first layer is in a range of $5 \leq d_1 \leq 200$ and a thickness $d_2$ (Å) of the second layer is in a range of $5 \leq d_2 \leq 30,000$.

3. The method for producing an epitaxial substrate for a compound semiconductor light-emitting device as claimed in claim 1, wherein the second layer is grown to satisfy the relationships:

$$5 \leq d_2 \leq 30,000 \ (900 \leq T_2 \leq 1,150)$$

$$T_2 \geq 0.4 \ d_2 + 700 \ (700 \leq T_2 < 900),$$

where $T_2$ (° C.) is the growth temperature of the second layer and $d_2$ (Å) is the thickness of the second layer.

4. The method for producing an epitaxial substrate for a compound semiconductor light-emitting device as claimed in claim 1, wherein the second layer and the third layer are grown by a regrowth method after growth of the first layer.

5. The method for producing an epitaxial substrate for a compound semiconductor light-emitting device as claimed in claim 3, wherein the second layer and the third layer are grown by a regrowth method after growth of the first layer.

6. A method for producing an epitaxial substrate for a compound semiconductor light-emitting device comprising:
   a double-hetero light-emitting layer structure including a pn junction; and a p-type layer side layer structure formed in contact with the light-emitting layer structure including in order from the layer in contact with the light-emitting layer structure an n-type first layer represented by $In_xAl_yGa_zN$ ($x+y+z=1$, $0 \leq x \leq 1$, $0 \leq y \leq 1$, $0 \leq z \leq 1$), an n-type second layer represented by $In_uAl_vGa_wN$ ($u+v+w=1$, $0 \leq u \leq 1$, $0 \leq v \leq 1$, $0 \leq w \leq 1$) and a p-type third layer represented by $In_pAl_qGa_rN$ ($p+q+r=1$, $0 \leq p \leq 1$, $0 \leq q \leq 1$, $0 \leq r \leq 1$), each of the three layers being formed in contact with its neighbor; said method comprising:

growing the substrate at a growth temperature $T_1$ of the first layer and a growth temperature of $T_2$ of the second layer are made to satisfy the relationship $T_1 \leq T_2$.

7. The method for producing an epitaxial substrate for a compound semiconductor light-emitting device as claimed in claim 6, wherein the second layer is grown to satisfy the relationships:

$$T_2 \geq 0.4\, d_2 + 700\ (5 \leq d_2 \leq 500)$$

$$1{,}150 \geq T_2 \geq 700,$$

where $T_2$ (° C.) is the growth temperature of the second layer and $d_2$ (Å) is the thickness of the second layer.

8. The method for producing an epitaxial substrate for a compound semiconductor light-emitting device as claimed in claim 6, wherein the second layer and the third layer are grown by a regrowth method after growth of the first layer.

9. The method for producing an epitaxial substrate for a compound semiconductor light-emitting device as claimed in claim 7, wherein the second layer and the third layer are grown by a regrowth method after growth of the first layer.

* * * * *